US012618139B2

(12) United States Patent
Hong et al.

(10) Patent No.: US 12,618,139 B2
(45) Date of Patent: May 5, 2026

(54) MANUFACTURING METHOD FOR PLATED STEEL MATERIAL HAVING EXCELLENT ADHESION TO PLATING AND CORROSION RESISTANCE

(71) Applicant: POSCO CO., LTD, Pohang-si (KR)

(72) Inventors: Seok-Jun Hong, Gwangyang-si (KR); Woo-Sung Jung, Gwangyang-si (KR)

(73) Assignee: POSCO CO., LTD, Pohang-si (KR)

( * ) Notice: Subject to any disclaimer, the term of this patent is extended or adjusted under 35 U.S.C. 154(b) by 0 days.

(21) Appl. No.: 18/813,705

(22) Filed: Aug. 23, 2024

(65) Prior Publication Data

US 2024/0417844 A1     Dec. 19, 2024

Related U.S. Application Data

(62) Division of application No. 17/414,747, filed as application No. PCT/KR2019/017843 on Dec. 17, 2019, now Pat. No. 12,077,845.

(30) Foreign Application Priority Data

Dec. 19, 2018     (KR) ......................... 10-2018-0165285

(51) Int. Cl.
    *C23C 30/00*      (2006.01)
    *B32B 15/01*      (2006.01)
    (Continued)

(52) U.S. Cl.
    CPC .............. *C23C 14/16* (2013.01); *B32B 15/01* (2013.01); *B32B 15/013* (2013.01); *B32B 15/04* (2013.01);
    (Continued)

(58) Field of Classification Search
    CPC ....... C23C 30/00; C23C 30/005; C23C 14/16; C23C 14/541; C23C 14/542;
    (Continued)

(56) References Cited

U.S. PATENT DOCUMENTS 5,747,111 A     5/1998  Fukui et al.
2009/0139872 A1  6/2009  Weiher et al.
(Continued)

FOREIGN PATENT DOCUMENTS

JP     H08134632     5/1996
JP     H09078229     3/1997
(Continued)

OTHER PUBLICATIONS

Machine Translation, Bang, A Study on Alloying Behavior and Corrosion/Adhesion Property of Zn—Mg—Zn Multi-layer Coated Steel, Master's thesis, Graduate School, Hanyang University, Feb. 2017 (Chapters 4 and 5). (Year: 2017).*
(Continued)

*Primary Examiner* — Michael E. La Villa
(74) *Attorney, Agent, or Firm* — CANTOR COLBURN LLP

(57)     ABSTRACT

Provided is a method of manufacturing a Zn—Mg alloy plated steel having excellent plating adhesion and corrosion resistance. The method includes: sequentially forming a first Zn plating layer, a second Mg plating layer, and a third Zn plating layer on base steel by a physical vapor deposition (PVD) method to provide a plated steel material; heating the plated steel material for alloying heat treatment to provide an alloy plated steel material; and cooling the alloy plated steel material. In the providing of the plated steel material, the second Mg plating layer has a thickness of 30% to 35% of the sum of thicknesses of the first Zn plating layer, the second Mg plating layer, and the third Zn plating layer, and the first Zn plating layer has a thickness of 1.1 to 4 times a thickness of the third Zn plating layer.

5 Claims, 1 Drawing Sheet

(51) Int. Cl.

| | |
|---|---|
| *B32B 15/04* | (2006.01) |
| *B32B 15/18* | (2006.01) |
| *C23C 14/02* | (2006.01) |
| *C23C 14/06* | (2006.01) |
| *C23C 14/14* | (2006.01) |
| *C23C 14/16* | (2006.01) |
| *C23C 14/24* | (2006.01) |
| *C23C 14/54* | (2006.01) |
| *C23C 14/58* | (2006.01) |
| *C23C 28/00* | (2006.01) |
| *C23C 28/02* | (2006.01) |

(52) U.S. Cl.
CPC ............ *B32B 15/043* (2013.01); *B32B 15/18* (2013.01); *C23C 14/024* (2013.01); *C23C 14/025* (2013.01); *C23C 14/06* (2013.01); *C23C 14/14* (2013.01); *C23C 14/24* (2013.01); *C23C 14/541* (2013.01); *C23C 14/542* (2013.01); *C23C 14/58* (2013.01); *C23C 14/5806* (2013.01); *C23C 14/5893* (2013.01); *C23C 28/02* (2013.01); *C23C 28/021* (2013.01); *C23C 28/023* (2013.01); *C23C 28/025* (2013.01); *C23C 28/3225* (2013.01); *C23C 30/00* (2013.01); *C23C 30/005* (2013.01); *Y10T 428/12799* (2015.01); *Y10T 428/12951* (2015.01); *Y10T 428/12972* (2015.01); *Y10T 428/2495* (2015.01); *Y10T 428/24959* (2015.01); *Y10T 428/24967* (2015.01); *Y10T 428/265* (2015.01)

(58) Field of Classification Search
CPC ............ C23C 14/5806; C23C 14/5893; C23C 14/024; C23C 14/025; C23C 14/06; C23C 14/14; C23C 14/24; C23C 14/58; C23C 28/02; C23C 28/021; C23C 28/023; C23C 28/025; C23C 28/3225; B32B 15/01; B32B 15/013; B32B 15/04; B32B 15/043; B32B 15/18; Y10T 428/12799; Y10T 428/12951; Y10T 428/12972; Y10T 428/2495; Y10T 428/24959; Y10T 428/24967; Y10T 428/265
See application file for complete search history.

(56) References Cited

U.S. PATENT DOCUMENTS

| | | | |
|---|---|---|---|
| 2015/0013409 A1 | 1/2015 | Monnoyer et al. | |
| 2015/0352812 A1 | 12/2015 | Jung et al. | |
| 2018/0237897 A1 | 8/2018 | Hashimoto et al. | |
| 2019/0345584 A1 | 11/2019 | Hong et al. | |
| 2019/0366687 A1 | 12/2019 | Kwak et al. | |
| 2020/0080205 A1 | 3/2020 | Ko et al. | |

FOREIGN PATENT DOCUMENTS

| | | | | |
|---|---|---|---|---|
| JP | H09111438 | 4/1997 | | |
| JP | H09143682 | 6/1997 | | |
| JP | H09228030 | 9/1997 | | |
| JP | 2000064011 | 2/2000 | | |
| JP | 2000239862 | 9/2000 | | |
| JP | 2002275611 | 9/2002 | | |
| JP | 2010275634 | 12/2010 | | |
| KR | 19940000086 | 1/1994 | | |
| KR | 100775241 | 11/2007 | | |
| KR | 20080058369 | 6/2008 | | |
| KR | 20130075918 | 7/2013 | | |
| KR | 20140083836 | 7/2014 | | |
| KR | 101819394 | 1/2018 | | |
| KR | 101867732 | 6/2018 | | |
| KR | 20180074990 | 7/2018 | | |
| WO | WO-2018117701 A1 * | 6/2018 | ............... | C23C 2/06 |
| WO | WO-2018117760 A1 * | 6/2018 | ............... | C23C 2/06 |

OTHER PUBLICATIONS

Bang, A Study on Alloying Behavior and Corrosion/Adhesion Property of Zn—Mg—Zn Multi-layer Coated Steel, Master's thesis, Graduate School, Hanyang University, Feb. 2017.

EP Extended Search Report issued Dec. 1, 2021 re: Application No. 19899562.3, pp. 1-7, citing: Byun et al. "Effect of heat treatment . . . " and Bang "A Study on Alloying . . . ".

International Search Report—PCT/KR2019/017843 dated Apr. 29, 2020.

Japanese Office Action—Japanese Application No. 2021-535736 issued on Jul. 26, 2022, citing Byun et al., Bang, JP H09-143682, JP H08-134632, JP H09-228030, JP H09-111438, JP H09-078229, and US 2015/0013409.

Byun et al., Effect of heat treatment on corrosion resistance and adhesion property in Zn—Mg—Zn multi-layer coated steel prepared by PVD process, Surface & Coatings Technology, 2017, vol. 309, pp. 1010-1014.

* cited by examiner

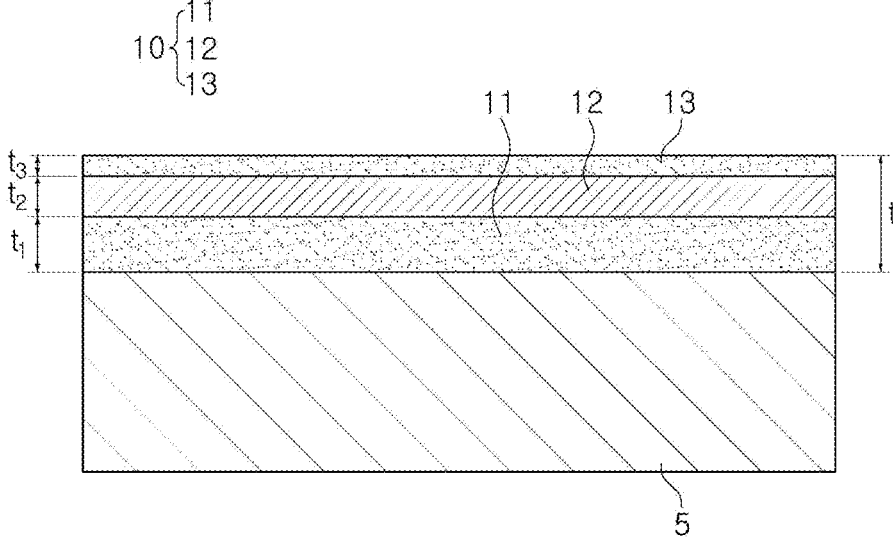

MANUFACTURING METHOD FOR PLATED STEEL MATERIAL HAVING EXCELLENT ADHESION TO PLATING AND CORROSION RESISTANCE

TECHNICAL FIELD

The present disclosure relates to a Zn—Mg alloy plated steel and a method of manufacturing the same, and more particularly, to a Zn—Mg alloy plated steel material which secures both plating adhesion and corrosion resistance, and a method of manufacturing the same.

BACKGROUND ART

A galvanizing method inhibiting corrosion of iron through a cathodic method has excellent anti-corrosion efficiency and economic feasibility and has been widely used in preparing steel materials having high anti-corrosion properties. A zinc plated galvanized steel material has sacrificial corrosion protection properties in which zinc, having an oxidation-reduction potential lower than iron, is first corroded when exposed to a corrosive environment, thereby inhibiting corrosion of the steel material, and in addition, as zinc of a plating layer is oxidized, dense corrosion products are formed on a surface of a steel sheet to block the steel material from an oxidizing environment, thereby improving corrosion resistance of the steel material.

However, air pollution has increased in line with industrial advancement and a corresponding corrosive environment has been intensified, and due to stricter regulations against resource and energy saving, the need to develop a steel material having improved excellent corrosion resistance as compared to existing galvanized steel sheets has increased, and as part of that, various studies have been conducted on Zn—Mg alloy plated steel in the art.

However, the currently developed Zn—Mg alloy plated steel materials involve many problems such as peeling during machining due to poor adhesion with a base material, and in order to solve such a problem, various methods such as changing a composition of a plating layer, configuring multiple plating layers, configuring an adhesive surface between a plating layer and a base material, and the like, have been proposed but the problem of a degradation of plating adhesion is yet to be overcome.

RELATED ART DOCUMENT (Patent document 1) Korean Patent Registration No. 10-0775241 (published on Nov. 12, 2007)

DISCLOSURE

Technical Problem

An aspect of the present disclosure may provide a Zn—Mg alloy plated steel material having excellent plating adhesion and corrosion resistance and a manufacturing method thereof.

The subject of the present disclosure is not limited to the above description. A person skilled in the art would have no difficulty in understanding an additional subject of the present disclosure from the general contents of the present disclosure.

Technical Solution

According to an aspect of the present disclosure, a Zn—Mg alloy plated steel material having excellent plating adhesion and corrosion resistance includes: base steel and a plating layer formed on a surface of the base steel, wherein the plating layer includes a Zn single phase, a Mg single phase, a $MgZn_2$ alloy phase and $Mg_2Zn_{11}$ alloy phase, the Zn single phase is included in the plating layer in a proportion of 15 volume % to 19 volume %, and a proportion of the Zn single phase in a lower t/2 region of the plating layer adjacent to the base steel is greater than a proportion of the Zn single phase in an upper t/2 region of the plating layer adjacent to a surface layer portion of the plating layer where t is a thickness (μm) of the plating layer.

The Mg single phase may be included in the plating layer in a proportion of 13 volume % to 20 volume %.

The $MgZn_2$ alloy phase may be included in the plating layer in a larger proportion than the $Mg_2Zn_{11}$ alloy phase.

The $Mg_2Zn_{11}$ alloy phase may be included in the plating layer in a proportion of 18 to 22 volume %.

The plating layer may have a thickness (t) of 2 μm to 10 μm.

According to an aspect of the present disclosure, a method of manufacturing a Zn—Mg alloy plated steel having excellent plating adhesion and corrosion resistance includes: sequentially forming a first Zn plating layer, a second Mg plating layer, and a third Zn plating layer on base steel by a physical vapor deposition (PVD) method to provide a plated steel material; heating the plated steel material for alloying heat treatment to provide an alloy plated steel material; and cooling the alloy plated steel material, wherein in the providing of the plated steel material, the second Mg plating layer has a thickness of 30% to 35% of the sum of thicknesses of the first Zn plating layer, the second Mg plating layer, and the third Zn plating layer, and the first Zn plating layer has a thickness of 1.1 to 4 times a thickness of the third Zn plating layer.

In the step of providing the plated steel material, the first Zn plating layer, the second Mg plating layer, and the third Zn plating layer may be formed to have a total thickness of 2 μm to 10 μm.

The providing of the plated steel material may include: a first intermediate cooling operation of cooling the first Zn plating layer to room temperature after forming the first Zn plating layer; a second intermediate cooling operation of cooling the second Mg plating layer to room temperature after forming the second Mg plating layer; and a third intermediate cooling operation of cooling the third Zn plating layer to room temperature after forming the third Zn plating layer.

In the providing of the alloy plated steel material, the plated steel material may be heated in a temperature range of 180° C. to 220° C., and a heating time of the plated steel material may be 120 seconds to 160 seconds.

In the cooling of the alloy plated steel material, the alloy plated steel material may be cooled to room temperature at a cooling rate of 5 to 15° C./s.

The foregoing technical solutions do not fully enumerate all of the features of the present invention. The foregoing and other objects, features, aspects and advantages of the present invention will become more apparent from the following detailed description of the present invention when taken in conjunction with the accompanying drawings.

Advantageous Effects

According to an aspect of the present disclosure, a Zn—Mg alloy plated steel material having significantly improved plating adhesion, while ensuring corrosion resistance, and a method of manufacturing the same may be provided.

DESCRIPTION OF DRAWINGS

FIG. 1 is a schematic cross-sectional view of a plated steel material including a first Zn plating layer, a second Mg plating layer, and a third Zn plating layer formed according to an embodiment of the present disclosure.

BEST MODE FOR INVENTION

The present disclosure relates to a Zn—Mg alloy plated steel material having excellent plating adhesion and corrosion resistance and a manufacturing method thereof, and hereinafter, exemplary embodiments of the present disclosure will be described. Embodiments of the present disclosure may be modified in various forms, and the scope of the present disclosure should not be construed as being limited to the embodiments described below. The present embodiments are provided in order to further detail the present disclosure to those skilled in the art to which the present disclosure pertains.

Hereinafter, a Zn—Mg alloy plated steel material having excellent plating adhesion and corrosion resistance according to an aspect of the present disclosure will be described in detail.

The Zn—Mg alloy plated steel of the present disclosure includes base steel and a plating layer formed on a surface of the base steel. In the present disclosure, an alloy composition the base steel and a shape thereof are not particularly limited. The base steel of the present disclosure may be interpreted as a concept including all steel materials provided for forming a plating layer and may be a steel sheet or a steel wire rod including, for example, C, Si, Mn, P, and S.

The plating layer of the present disclosure may include Zn and Mg, and Zn and Mg may be included in the plating layer in a ratio of about 1:2 by volume %. The plating layer of the present disclosure may include Zn and Mg and is provided through an alloying treatment in a predetermined temperature range for a predetermined period of time, so that an alloyed region and an unalloyed region may coexist. A Zn single phase and a Mg single phase may exist in the unalloyed region, and a Mg—Zn-based alloy phase may exist in the alloyed region.

The inventors of the present disclosure conducted in-depth studies on a Zn—Mg-based plating layer in which corrosion resistance and plating adhesion are compatible, and as a result, found that intended corrosion resistance and plating adhesion could be secured by controlling fraction of a Zn single phase, an Mg single phase, and a Zn—Mg-based alloy phase included in the Zn—Mg-based plating layer within an optimal range.

Since the Mg—Zn-based alloy phase has low ductility compared to the Zn single phase and the Mg single phase, formation of the plating layer with only the Mg—Zn-based alloy phase is not desirable in terms of securing plating adhesion. Thus, in the present disclosure, plating adhesion is intended to be improved by securing a proportion of the Zn single phase and Mg single phase in the plating layer to a certain level or higher. In addition, since the Mg—Zn-based alloy phase is effective in improving corrosion resistance compared to the Zn single phase and the Mg single phase, configuring the plating layer only with the Zn single phase and the Mg single phase is not desirable in terms of improvement of corrosion resistance. Therefore, the present disclosure intends to improve corrosion resistance by introducing the Mg—Zn-based alloy phase into the plating layer.

In the present disclosure, the proportion of Zn single phase in the plating layer to 15% to 19% by volume. If the proportion of the Zn single phase in the plating layer is less than 15% by volume, an effect of absorbing deformation caused by the Zn single phase and the Mg single phase during machining of the plated steel material is insufficient, and thus, peeling of the plating layer may occur. In addition, the proportion of Zn single phase in the plating layer exceeding 19% by volume may be desirable in terms of securing plating adhesion, but the proportion of the Mg—Zn-based alloy phase in the plating layer is not sufficient, which may degrade corrosion resistance of the plated steel material.

The proportion of the Mg single phase in the plating layer is determined according to a Zn content and a Mg content in the plating layer and the degree of alloying, and the plating layer of the present disclosure may include a Mg single phase of 14% to 20% by volume. As with the limitation on the proportion of Zn single phase, if the proportion of Mg single phase in the plating layer is less than 14% by volume, plating adhesion may decrease, and if the proportion of Mg single phase in the plating layer exceeds 20% by volume, corrosion resistance of the plated steel material may be lowered.

In addition, in the present disclosure, a lower t/2 region of the plating layer adjacent to the base steel is controlled to include the Zn single phase in a larger proportion than in an upper t/2 region of a surface layer portion of the plating layer, plating adhesion may be more effectively secured. That is, since the Zn single phase, which contributes to the improvement of the adhesion in the plating layer, is controlled to be formed more on an interface side with the base steel, adhesion between the plating layer and the base steel may be more effectively improved. Here, t represents a thickness (μm) of the plating layer.

Mg—Zn-based alloy phases include a $Mg_2Zn_{11}$ alloy phase, a $MgZn_2$ alloy phase, a $MgZn$ alloy phase, a M $Mg_7Zn_3$ alloy phase, and the like. The results of the studies of the present inventors confirmed that the $Mg_2Zn_{11}$ alloy phase and the $MgZn_2$ alloy phase effectively contributed to the improvement of corrosion resistance. Thus, the Mg—Zn-based alloy phase included in the plating layer of the present disclosure may be limited to the $Mg_2Zn_{11}$ alloy phase or the $MgZn_2$ alloy phase. If an alloyed region includes only the $Mg_2Zn_{11}$ alloy phase, gloss degradation may occur, and if the alloyed region includes only the $MgZn_2$ alloy phase, peeling of the plating layer may be accelerated due to high brittleness of the $MgZn_2$ alloy phase. Thus, the plating layer of the present disclosure preferably includes a mixture of the $Mg_2Zn_{11}$ alloy phase and the $MgZn_2$ alloy phase.

In addition, in the present disclosure, the $MgZn_2$ alloy phase is preferably included in the plating layer in a larger proportion than the $Mg_2Zn_{11}$ alloy phase. The $MgZn_2$ alloy phase is more brittle than the $Mg_2Zn_{11}$ alloy phase and thus is not preferable in terms of plating adhesion. However, the $MgZn_2$ alloy phase contributes effectively to the improvement of corrosion resistance than the $Mg_2Zn_{11}$ alloy phase and since the plating layer of the present disclosure includes a Zn single phase and a Mg single phase and is designed to absorb a partial amount of difference in deformation during machining, and thus, it is more preferred that the $MgZn_2$ alloy phase is included in the plating layer in a larger proportion than the $Mg_2Zn_{11}$ alloy phase in terms of the improvement of corrosion resistance. Accordingly, in the present disclosure, the $Mg_2Zn_{11}$ alloy phase may be included in the plating layer in a proportion of 18 to 22% by volume, and the $MgZn_2$ alloy phase may constitute the remaining components of the plating layer.

The plating layer of the present disclosure may have a thickness of 2 to 10 µm. If the thickness of the plating layer is less than 2 µm, a sufficient effect of improving corrosion resistance cannot be expected, and if the thickness of the plating layer exceeding 10 µm is not preferable in terms of economical efficiency.

Hereinafter, a method of manufacturing a Zn—Mg alloy plated steel material having excellent plating adhesion and corrosion resistance according to an aspect of the present disclosure will be described in detail. However, the manufacturing method described below is an example of manufacturing the plated steel material of the present disclosure, and the plated steel material of the present disclosure is not necessarily manufactured only by the manufacturing method described below.

A method of manufacturing a Zn—Mg alloy plated steel having excellent plating adhesion and corrosion resistance according to an aspect of the present disclosure may include sequentially forming a first Zn plating layer, a second Mg plating layer, and a third Zn plating layer on base steel by a physical vapor deposition (PVD) method to provide a plated steel material; heating the plated steel material for alloying heat treatment to provide an alloy plated steel material; and cooling the alloy plated steel material, wherein in the providing of the plated steel material, the second Mg plating layer has a thickness of 30% to 35% of the sum of thicknesses of the first Zn plating layer, the second Mg plating layer, and the third Zn plating layer, and the first Zn plating layer has a thickness of 1.1 to 4 times a thickness of the third Zn plating layer. A preferred thickness ratio of the first Zn plating layer and the third Zn plating layer may be 1.3 to 4:1, and a more preferred thickness ratio of the first Zn plating layer and the third Zn plating layer may be 1.5 to 4:1.

FIG. 1 is a schematic cross-sectional view of a plated steel material including a first Zn plating layer, a second Mg plating layer, and a third Zn plating layer formed according to an embodiment of the present disclosure.

In the operation of providing a plated steel material of the present disclosure, as shown in FIG. 1, a first Zn plating layer 11, a second Mg plating layer 12, and a third Zn plating layer 13 may be sequentially formed on a base steel 5 to form a plating layer 10. The plating layer is preferably formed in the order of a Zn layer, an Mg layer, and a Zn layer to secure adhesion between the plating layer and the base steel and to ensure uniform corrosion resistance in the plating layer after allowing.

A method of forming the first Zn plating layer 11, the second Mg plating layer 12, and the third Zn plating layer 13 is not particularly limited, but a physical vapor deposition (PVD) method may be used. In addition, in order to prevent diffusion between the first Zn plating layer 11, the second Mg plating layer 12, and the third Zn plating layer 13, intermediate cooling to cool to room temperature after the formation of each of the plating layers 11, 12, and 13.

The plating layer 10 of the present disclosure may be formed to have a thickness of 2 to 10 µm. If the thickness of the plating layer 10 is less than 2 µm, a sufficient effect of improving corrosion resistance cannot be expected, and a thickness of the plating layer 10 exceeding 10 µm is not preferable in terms of economical efficiency.

The first Zn plating layer 11, the second Mg plating layer 12, and the third Zn plating layer 13 may have a first thickness t1, a second thickness t2, and a third thickness t3, respectively. The second thickness t2 is preferably formed at a level of 30% to 35% of a thickness of the entire plating layer 10 (t=t1+t2+t3). If the second thickness t2 exceeds 35% of the thickness of the entire plating layer 10 (t=t1+t2+t3), the Mg content in the plating layer 10 may be excessive and the proportion of the Zn single phase in the plating layer 10 after alloying may not reach an intended level, and if the thickness t2 is less than 30% of the thickness (t=t1+t2+t3) of the entire plating layer 10, the Mg content in the plating layer 10 is insufficient so that the proportion of the Zn single phase in the plating layer 10 exceeds the level intended by the proportion of the Zn single phase in the plating layer 10.

In addition, since the Zn single phase contributes to the improvement of adhesion between the plating layer and the base steel, the presence of a large amount of the Zn single phase near the interface between the base steel and the plating layer after alloying is advantageous in securing the plating adhesion. Accordingly, in the present disclosure, the plating layer 10 is formed ($1.1 \times t3 \leq t1$, µm) so that the first Zn plating layer 11 has a thickness of 1.1 times or more the third Zn plating layer 13 to form a relatively large amount of Zn single phase on the interface side with the base steel after alloying, and accordingly, plating adhesion may be effectively secured. A preferred thickness of the first Zn plating layer 11 may be at least 1.3 times the thickness of the third Zn plating layer 13, and the more preferred thickness of the first Zn plating layer 11 may be at least 1.5 times the thickness of the third Zn plating layer 13.

If the thickness t1 of the first Zn plating layer 11 exceeds the thickness t3 of the third Zn plating layer 13 by four or more times, the effect of improving plating adhesion due to the formation of a Zn single phase adjacent to the base steel may be saturated and the intended Mg—Zn-based alloy phase cannot be sufficiently formed, which is thus not preferable in terms of securing corrosion resistance. Therefore, the thickness t1 of the first Zn plating layer 11 of the present disclosure may be limited to 4 times or less ($t1 \leq 4 \times t3$, µm) of the thickness t3 of the third Zn plating layer 13.

The plated steel material including the plating layer described above may be heated in a temperature range of 180° C. to 220° C. for 120 to 160 seconds so as to be alloyed. The alloying treatment temperature range of 180° C. to 220° C. is a temperature range reflecting precise control of melting points and alloying degree of Zn and Mg, and the alloying time of 120 to 160 seconds is to secure 15 to 19% by volume of Zn single phase in the plating layer within the corresponding temperature range.

The alloyed plated steel material may be cooled to room temperature at a cooling rate of 5 to 15° C./s.

MODE FOR INVENTION

Hereinafter, the present disclosure will be described in more detail through examples. However, it should be noted that the following examples are only for exemplifying the present disclosure and not for limiting the scope of the present disclosure.

Example 1

Each specimen was formed by positioning base steel in a chamber with a vacuum degree maintained to be $10^{-5}$ torr or lower and sequentially forming a first Zn plating layer, a second Mg plating layer, and a third Zn plating layer by a PVD method. Here, a thickness of the plating layers of each specimen was adjusted as illustrated in Table 1 below. When the plating layers were formed, a separate heat source was not supplied to the base steel, and a sufficient cooling time was given when each plating layer was formed so that diffusion between each plating layer by latent heat of solidification did not occur. Thereafter, an atmosphere temperature in the chamber was raised to 200° C. at a rate of 30° C./s, subjected to an alloying heat treatment for 140 seconds, and then cooled to room temperature at a rate of 10° C./s.

Subsequently, a proportion of a Zn single phase in the plating layer was measured by a reference intensity ratio (RIR) method for each specimen, and the results are also illustrated in Table 1 below. In Table 1, the proportion of the upper Zn single phase refers to a volume fraction of the Zn single phase in an upper region of the thickness t/2 of the plating layer corresponding to the surface layer portion of the plating layer, and a proportion of a lower Zn single phase refers to a volume fraction of the Zn single phase in a lower region of the thickness t/2 of the plating layer corresponding to a position adjacent to the base steel. Plating adhesion and corrosion resistance were evaluated for each specimen, and results thereof are also illustrated in Table 1.

Plating adhesion was evaluated by performing a bending test after bending each specimen at an angle of 180°. When an adhesive tape (Nitto tape) was attached to a front surface of the specimen and removed in a bent portion, a case in which the alloy layer did not come out at all was evaluated as being excellent and a case in which some alloy layers were present on the tape was evaluated as being insufficient.

Corrosion resistance was evaluated by loading each specimen to a salt spray tester (TS-CASS) and measuring red rust occurrence time based on the international standard (ASTM B117). At this time, 5% brine (temperature 35° C., pH 7) was used, a pressure of compressed air was set to 0.1 MPa, and 15 ml/80 cm$^2$ of brine was sprayed per hour. A temperature in the chamber in which the specimen was located was set to be equal to 35° C. as the temperature of the brine. In order to evaluate corrosion resistance of only the plating layer by preventing corrosion occurring from the edge of the specimen, the edge of each specimen was sealed with an adhesive tape (Nitto tape). As a result of such a corrosion resistance evaluation test, the red rust occurrence time which is 300 hours or more may be evaluated as excellent, 200 hours or more but less than 300 hours may be evaluated to be insufficient, and less than 200 hours may be evaluated as poor.

In the case of specimen A in which the first Zn plating layer had a thickness less than 1.1 times a thickness of the third Zn plating layer, the proportion of Zn single phase in the lower t/2 region in the plating layer was lower than the proportion of Zn single phase in the upper t/2 region in the plating layer. As a result, it can be seen that the plating adhesion was inferior.

On the other hand, in the case of specimens B to D in which the first Zn plating layer had a thickness of 1.1 times or more the thickness of the third Zn plating layer, the proportion of Zn single phase in the lower t/2 region in the plating layer is higher than the proportion of Zn single phase in the upper t/2 region, and as a result, it can be seen that plating adhesion was excellent.

However, in the case of specimen D in which the first Zn plating layer had a thickness exceeding 4 times the thickness of the third Zn plating layer, it can be seen that plating adhesion was excellent, while corrosion resistance was insufficient. In the case of specimen D, it can be seen that the proportion of the Mg—Zn-based alloy phase on the surface layer portion of the plating layer was less than an intended level, so that corrosion resistance was relatively poor.

Example 2

Each specimen was formed by positioning base steel in a chamber with a vacuum degree maintained to be $10^{-5}$ torr or lower and sequentially forming a first Zn plating layer, a second Mg plating layer, and a third Zn plating layer by a PVD method. Here, the first Zn plating layer, the second Mg plating layer, and the third Zn plating layer were formed to have thickness of 2.2 μm, 2 μm, and 1.8 μm, respectively. When the plating layers were formed, a separate heat source was not supplied to the base steel, and a sufficient cooling time was given when each plating layer was formed so that diffusion between each plating layer by latent heat of solidification did not occur. Thereafter, an atmosphere temperature in the chamber was raised to 200° C. at a rate of 30° C./s, subjected to an alloying heat treatment, and then cooled to room temperature at a rate of 10° C./s. At this time, the alloying heat treatment time (time during which the atmosphere temperature in the chamber was maintained at 200° C.) was different for each specimen, and it is shown in Table 2 below.

Subsequently, the proportions of the Zn single phase, Mg single phase, MgZn$_2$ alloy and Mg$_2$Zn$_{11}$ alloy in the plating layer were measured by the RIR method for each specimen, and the results are shown in Table 2 below. In addition, corrosion resistance and plating adhesion were evaluated for each specimen, and the results are also illustrated in Table 2. Evaluation of corrosion resistance and plating adhesion was performed under the same conditions as those of Example 1.

TABLE 1

| | Thickness of plating layer (μm) | | | Proportion (volume %) of Zn single phase | | | Initial red rust |
|---|---|---|---|---|---|---|---|
| Specimen No. | First Zn layer | 'Second Mg layer | Third Zn layer | Lower t/2 region | Upper t/2 region | Evaluation of adhesion | occurrence time (hr) |
| A | 1.8 | 2 | 2.2 | 15.2 | 18.8 | Insufficient | 332 |
| B | 2.2 | 2 | 1.8 | 18.6 | 15.4 | Excellent | 327 |
| C | 2.5 | 2 | 1.5 | 21.2 | 12.7 | Excellent | 319 |
| D | 3.3 | 2 | 0.7 | 25.5 | 6.2 | Excellent | 286 |

TABLE 2

| Specimen No | Heat treatment time (s) | Structure proportion (volume %) | | | | Evaluation adhesion | Corrosion resistance | |
| | | Zn single phase | Mg single phase | MgZn$_2$ alloy phase | Mg$_2$Zn$_{11}$ alloy phase | | Initial red rust occurrence time (hr) | Evaluation |
|---|---|---|---|---|---|---|---|---|
| 1 | 0 | 48 | 37 | 4 | 11 | Excellent | 164 | Poor |
| 2 | 60 | 42 | 33 | 6 | 19 | Excellent | 252 | Insufficient |
| 3 | 100 | 32 | 28 | 13 | 27 | Excellent | 276 | Insufficient |
| 4 | 120 | 18 | 19 | 38 | 25 | Excellent | 323 | Excellent |
| 5 | 140 | 17 | 16 | 46 | 21 | Excellent | 335 | Excellent |
| 6 | 160 | 16 | 14 | 51 | 19 | Excellent | 362 | Excellent |
| 7 | 200 | 13 | 8 | 68 | 11 | Insufficient | 433 | Excellent |
| 8 | 360 | 1 | 2 | 85 | 12 | Insufficient | 520 | Excellent |
| 9 | 480 | 0 | 0 | 87 | 13 | Insufficient | 521 | Excellent |

In the case of specimens 3 to 6 in which the alloying heat treatment time satisfied the range of 120 to 160 seconds, the proportion of the Zn single phase satisfied the range of 15 to 19% by volume, thereby securing plating adhesion and corrosion resistance intended by the present disclosure On the other hand, in the case of specimens 7 to 9 in which the alloying heat treatment time exceeded 160 seconds, it can be seen that the proportion of the Zn single phase was less than 15 volume % and plating adhesion was inferior. In the case of specimens 1 to 3 in which the alloying heat treatment time was less than 120 seconds, it can be seen that the proportion of the Zn single phase exceeded 19 volume % and corrosion resistance was poor.

Therefore, according to an aspect of the present disclosure, a Zn—Mg alloy plated steel material having significantly improved plating adhesion, while securing corrosion resistance, and a method of manufacturing the same may be provided.

Although the present disclosure has been described in detail through the examples above, other types of examples are also possible. Therefore, the technical spirit and scope of the claims set forth below are not limited to the embodiments.

The invention claimed is:

1. A method of manufacturing a Zn—Mg alloy plated steel having excellent plating adhesion and corrosion resistance, the method comprising:

sequentially forming a first Zn plating layer, a second Mg plating layer, and a third Zn plating layer on a base steel by a physical vapor deposition (PVD) method to form a plated steel material on the base steel;

after forming the plated steel material, heating the plated steel material for alloying heat treatment to form an alloy plated steel material on the base steel; and cooling the alloy plated steel material, wherein the second Mg plating layer has a thickness of 30% to 35% of a total thickness of the first Zn plating layer, the second Mg plating layer, and the third Zn plating layer, the first Zn plating layer has a thickness of 1.1 to 4 times a thickness of the third Zn plating layer, and the first Zn layer has a thickness exceeding 2 μm.

2. The method of claim 1, wherein the total thickness is less than 10 μm.

3. The method of claim 1, wherein the sequentially forming includes:

performing a first intermediate cooling of the first Zn plating layer to room temperature after forming the first Zn plating layer;

performing a second intermediate cooling of the second Mg plating layer to room temperature after forming the second Mg plating layer; and performing a third intermediate cooling of the third Zn plating layer to room temperature after forming the third Zn plating layer.

4. The method of claim 1, wherein the heating the plated steel material includes: heating the plated steel material in a temperature range of 180° C. to 220° C. for 120 seconds to 160 seconds.

5. The method of claim 1, wherein the cooling the alloy plated steel material includes: cooling the alloy plated steel material to the room temperature at a cooling rate of 5 to 15° C./s.

* * * * *